(12) United States Patent
Ohashi

(10) Patent No.: US 6,729,389 B2
(45) Date of Patent: *May 4, 2004

(54) HEAT TRANSFER APPARATUS WITH ZIGZAG PASSAGE

(75) Inventor: Isao Ohashi, Gifu (JP)

(73) Assignee: STS Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/791,183

(22) Filed: Feb. 23, 2001

(65) Prior Publication Data

US 2001/0045276 A1 Nov. 29, 2001

(30) Foreign Application Priority Data

Feb. 24, 2000 (JP) .................................... P2000-047961

(51) Int. Cl.[7] .................................................. F28F 3/12
(52) U.S. Cl. ...................................... 165/168; 165/170
(58) Field of Search .............................. 165/80.3, 80.4, 165/109.1, 168, 169, 170

(56) References Cited

U.S. PATENT DOCUMENTS

| | | | | |
|---|---|---|---|---|
| 47,298 A | * | 4/1865 | Hammer | |
| 289,859 A | * | 12/1883 | Roberts | |
| 880,237 A | * | 2/1908 | Obenauer | |
| 897,792 A | * | 9/1908 | Silvey | |
| 1,094,256 A | * | 4/1914 | Schewczik | |
| 1,273,162 A | * | 7/1918 | Ehmke | |
| 1,311,049 A | * | 7/1919 | Crossano | |
| 1,318,875 A | * | 10/1919 | Hutchinson | |
| 1,322,897 A | * | 11/1919 | Gray | |
| 1,527,689 A | * | 2/1925 | Lewis | |
| 1,633,271 A | * | 6/1927 | Pauly | |
| 1,664,628 A | * | 4/1928 | Kessler | |
| 1,693,249 A | * | 11/1928 | Pauly | |
| 1,962,954 A | * | 6/1934 | Gofferje | 257/256 |
| 2,572,972 A | * | 10/1951 | Baldwin | 257/256 |
| 2,981,520 A | * | 4/1961 | CHadburn | 257/256 |
| 3,181,605 A | * | 5/1965 | Smith, Jr. | 165/90 |
| 3,246,689 A | * | 4/1966 | Remde Etal | 165/53 |
| 3,327,776 A | * | 6/1967 | Butt | 165/80.4 |
| 3,621,909 A | * | 11/1971 | Smith, Jr. | 165/168 |
| 3,800,868 A | * | 4/1974 | Berkowitz et al. | 165/170 |
| 4,085,728 A | | 4/1978 | Tomchak | 126/270 |
| 4,136,675 A | * | 1/1979 | Karasick | 126/271 |
| 4,574,876 A | * | 3/1986 | Aid | 165/46 |
| 4,801,778 A | * | 1/1989 | Mizutani et al. | 219/10.81 |
| 4,874,035 A | | 10/1989 | Kashiwada et al. | 165/38 |
| 4,903,640 A | * | 2/1990 | Howard | 122/6 A |
| 5,289,872 A | * | 3/1994 | Kent | 165/133 |
| 5,510,207 A | * | 4/1996 | Grivel et al. | 429/120 |
| 5,519,946 A | * | 5/1996 | Renzi | 34/239 |
| 5,642,775 A | * | 7/1997 | Akachi | 165/104.14 |
| 6,026,890 A | * | 2/2000 | Akachi | 165/104.26 |
| 6,138,354 A | * | 10/2000 | Kobayashi et al. | 29/890.049 |

FOREIGN PATENT DOCUMENTS

GB 2 271 630 A 4/1994 ............. F28F/9/02

* cited by examiner

Primary Examiner—Henry Bennett
Assistant Examiner—Nihir Patel
(74) Attorney, Agent, or Firm—Akin Gump Strauss Hauer & Feld, L.L.P.

(57) ABSTRACT

A heat transfer apparatus with a zigzag passage is provided. The apparatus includes a pair of opposed plates 11, 12, a bent plate 21 having a wavy cross sectional shape for dividing the space between both plates into a plurality of side-by-side passages 20a, 20b, and a pair of cover members 13, 14, bonded to the bent plate 21, for forming connecting portions 20c, 20d between the side-by-side passages. One sidewall portion 23a of both sidewall portions 23a, 23b of the bent plate 21 is coupled to the cover member 13 on one end of a rectangular groove. The other sidewall portion 23b is coupled to the cover member 14 on the other end of the rectangular groove. Thus, a zigzag passage 20 is formed in which one side of the rectangular groove is folded to oppose the other side of the rectangular groove.

12 Claims, 19 Drawing Sheets

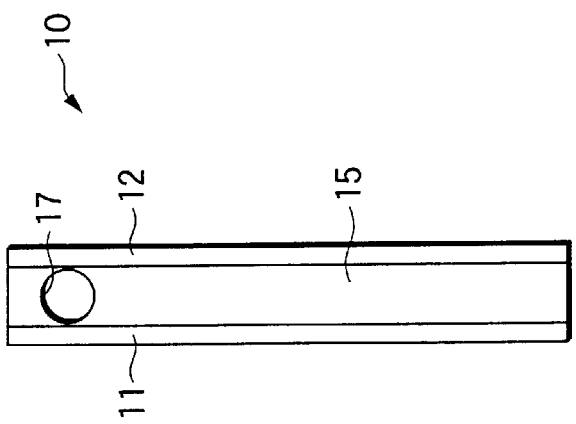
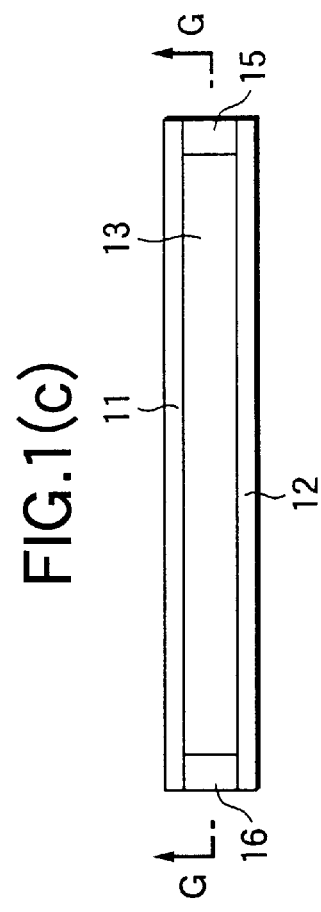

SECT G-G

SECT H-H

SECT X-X

SECT Y-Y

SECT Z-Z

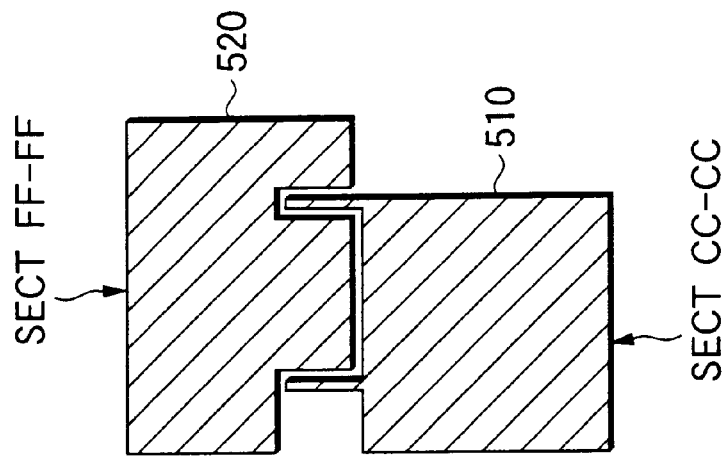
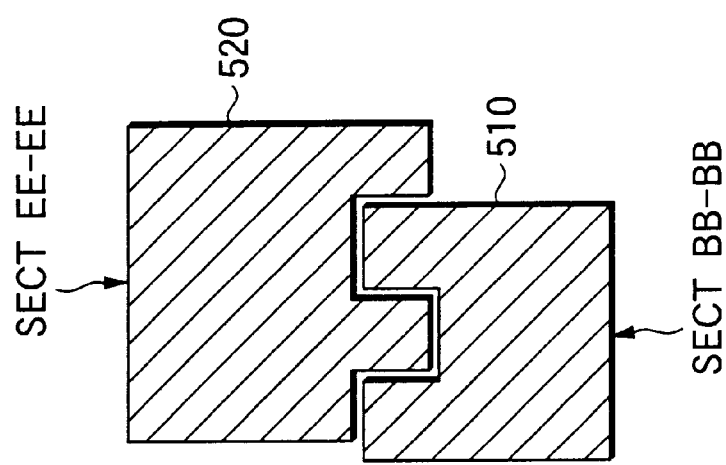
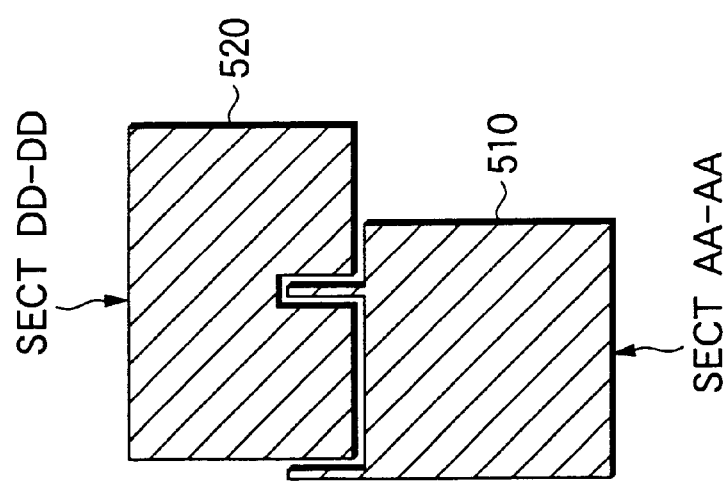

SECT S-S

SECT T-T

SECT F-F

SECT E-E

SECT D-D

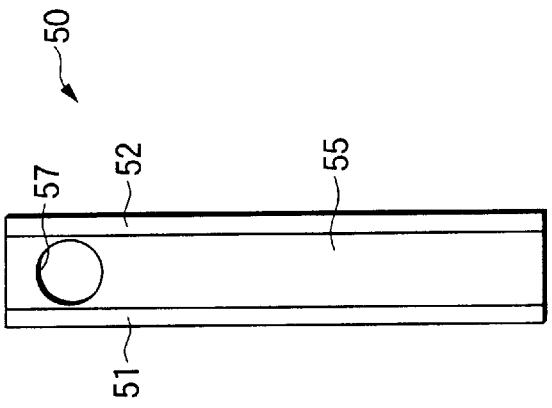
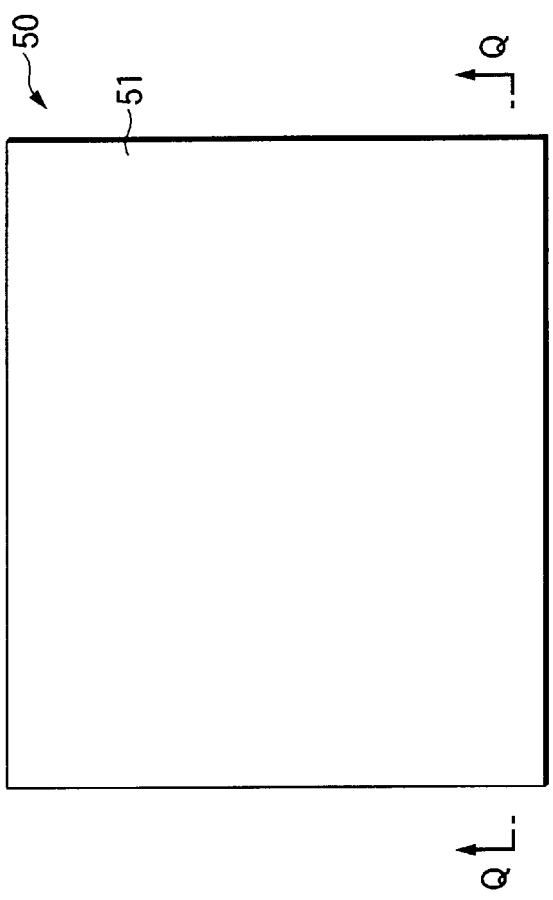
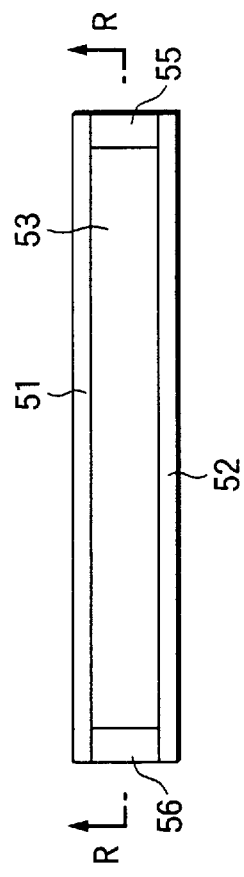

SECT R-R

SECT Q-Q

SECT B-B

SECT M-M

SECT N-N

HEAT TRANSFER APPARATUS WITH ZIGZAG PASSAGE

BACKGROUND OF THE INVENTION

The present invention relates to heat transfer apparatuses with a zigzag passage and more particularly to a heat transfer apparatus with a zigzag passage which can be effectively used for plate-type heat exchangers or zigzag heat pipes.

Conventionally, to cool down electronic devices, an air cooling system has been frequently used with heat radiation members (heat sinks) such as fins that are in close contact with the heat generating portion of the devices. However, when heat cannot be dissipated desirably into the air and a high level of cooling is required, a forced cooling device that employs a liquid such as water having a high specific heat is used instead of or in conjunction with the air cooling system. In the latter case, frequently used is a plate-type heat exchanger which can be easily handled and readily brought into contact with a heat generating portion of the electronic device.

The plate-type heat exchanger of this type includes one with a zigzag pipe shown in FIG. 18 and another with plates affixed thereto shown in FIG. 19. First, the plate-type heat exchanger with a zigzag pipe shown in FIG. 18 has a metallic pipe with good heat conductivity, which has a predetermined diameter and is formed into a zigzag pipe in the same plane by folding the pipe in a U-shaped configuration at given lengths. A plate or plates with good heat conductivity are brazed to one or both sides of the zigzag pipe. On the other hand, the one shown in FIG. 19 has a zigzag groove which is folded at a given length of the groove in the general shape of the letter "U" or rectangle at least on one plane of the opposite surfaces of a pair of plates. The plates are affixed to each other to form a zigzag passage.

In addition, though not shown, such a heat exchanger is also known in which a raw metal sheet is pressed to form a plate with projections (ridges) for forming passages. A pair of the plates having a target shape is brazed to each other at the top end portion of the projections (ridges) to form the passages.

However, the aforementioned heat transfer apparatus with a zigzag passage could not allow a metal pipe to be bent in a zigzag manner with a small curvature at the U-turn portions. (For example, a pipe of pure copper cannot be provided with a minimum bending radius approximately 1.5 times the outer diameter of the pipe.) Accordingly, this allowed the pitch of adjacent passages to be narrowed within limitation.

In addition, to provide grooves requiring a depth for the plates, it was considerably difficult to make the wall between adjacent grooves thinner than approximately 0.5 mm in thickness, by general cutting methods from the viewpoint of cutting cost and durability.

Furthermore, taking pressed plates to be brazed to each other at the top end portion of the projections (ridges). In this case, a certain width is required of the abutting joint portion of the projections (ridges). This caused adjacent passages to be spaced apart by the amount of the joint width and therefore the pitch between adjacent passages could be narrowed within limitation.

As described above, it was difficult to narrow the pitch between adjacent fluid passages of the conventional plate-type heat transfer apparatus. Therefore, the cooling area (heat exchange area) per unit heat transfer area could be enlarged with limitation, thereby making it impossible to improve heat transfer efficiency and causing an increase in cost due to the difficulty of cutting.

SUMMARY OF THE INVENTION

In view of the aforementioned circumstances, the present invention is to realize a simple zigzag piping structure which allows the walls between adjacent passages to be made thinner and sturdy and thereby provide a low-cost heat transfer apparatus having a good heat efficiency.

To solve the aforementioned problems, a heat transfer apparatus with a zigzag passage according to a preferred embodiment of the present invention comprises a pair of opposed plates opposite to each other with at least one of the pair of the opposed plates forming a heat transfer surface; a bent plate, having a wavy cross-sectional shape, for forming rectangular grooves opposite to each other in a cross section of the passage so as to divide a space between said opposed plates into a plurality of side-by-side passages; and a pair of cover members bonded to said bent plate at both ends of the rectangular grooves of said bent plate and forming connecting portions between said side-by-side passages. The heat transfer apparatus with a zigzag passage is characterized in that one side wall portion of both side wall portions of the rectangular grooves of said bent plate is coupled to one end cover member of said rectangular grooves, the other side wall portion of both side wall portions of said rectangular grooves is coupled to the cover member on the other end of said rectangular grooves, and thus a zigzag passage is formed in which one side of the rectangular groove is folded to oppose the other side of the rectangular groove. In this configuration, the bent plate can be easily manufactured by pressing or the like. In addition, said side wall portion or a rib between adjacent passages is provided with a thickness of the plate-shaped material for forming the bent plate, thereby being made thin and sturdy. This allows the spacing between adjacent passages to be narrowed. Furthermore, the bent plate can be bonded to the opposed plates at a wide area using the bottom wall portion of said rectangular grooves, thereby making it possible to provide a sufficient bonding strength.

In the aforementioned heat transfer apparatus with a zigzag passage, it is preferable that on any one of a crest or trough of a waveform of said bent plate, provided are one bottom wall extended portion formed by extending the bottom wall portion of said rectangular grooves toward both ends and another bottom wall extended portion; said one side wall portion is extended to one side of said rectangular grooves and said other side wall portion is extended to the other end of said rectangular grooves to provide one side wall extended portion and another bottom wall extended portion; and said one bottom wall extended portion and said one side wall extended portion are coupled to the cover members on one end of said rectangular grooves and said other bottom wall extended portion and said other side wall extended portion are coupled to a cover member on the other side of said rectangular grooves. In this configuration, the bent plate is provided with the side wall extended portion and the bottom wall extended portion, thereby making it possible to facilitate the attachment of the cover members.

In this case, it is more preferable that said bottom wall extended portion is extended sideward of the side wall extended portion of adjacent rectangular grooves, a portion extended sideward of said bottom wall extended portion and said side wall extended portion of the adjacent rectangular grooves are integrally coupled to each other by a plate-shaped coupling portion opposite to the side wall extended portion of the adjacent rectangular grooves; and said one side wall extended portion is integrally formed via said one bottom wall extended portion as well as said other side wall extended portion is integrally formed via said other bottom wall extended portion. In this configuration, the bent plate is provided with no projections, and allows the opposed plates and the cover members to be readily bonded thereto and easily handled. Moreover, it is made possible to shear and bend the bent plate by pressing or the like.

The present disclosure relates to the subject matter contained in Japanese patent application No. 2000–47961 (filed on Feb. 24, 2000), which is expressly incorporated herein by reference in its entirety.

BRIEF DESCRIPTION OF THE DRAWINGS

FIGS. 1(a), (b), and (c) illustrate a heat transfer apparatus with a zigzag pipe according to a first embodiment of the present invention; (a) being a plan view thereof, (b) being a side view thereof, and (c) being a front view thereof.

FIGS. 7(a), (b), and (c) illustrate the press die for pressing the bent plate for the heat transfer apparatus with the zigzag pipe according to the first embodiment; (a) being a cross sectional view illustrating a combination of the section DD—DD of FIG. 5 and the section AA—AA of FIG. 6, (b) being a cross sectional view illustrating a combination of the section EE—EE of FIG. 5 and the section BB—BB of FIG. 6, and (c) being a cross sectional view illustrating a combination of the section FF—FF of FIG. 5 and the section CC—CC of FIG. 6.

FIGS. 12(a), (b), and (c) illustrate a heat transfer apparatus with a zigzag pipe according to a third embodiment of the present invention; (a) being a plan view thereof, (b) being a side view thereof, and (c) being a front view thereof.

DESCRIPTION OF THE PREFERRED EMBODIMENT

The preferred embodiments of the present invention will be explained below with reference to the drawings.

[First Embodiment]

Figure 4A:
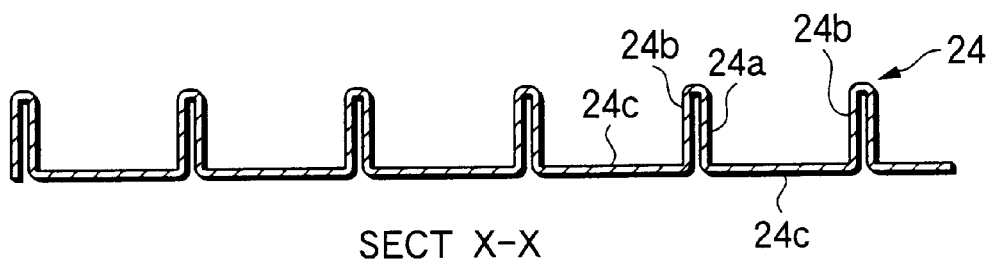
FIGS. 4(a), (b), and (c) illustrate a cross-sectional shape of the bent plate in the heat transfer apparatus with the zigzag pipe according to the first embodiment; (a) being a cross-sectional view taken along the line X—X of FIG. 3(a), (b) being a cross-sectional view taken along the line Y—Y of FIG. 3(b), and (c) being a cross-sectional view taken along the line Z—Z of FIG. 3(a).
Figure 4B:
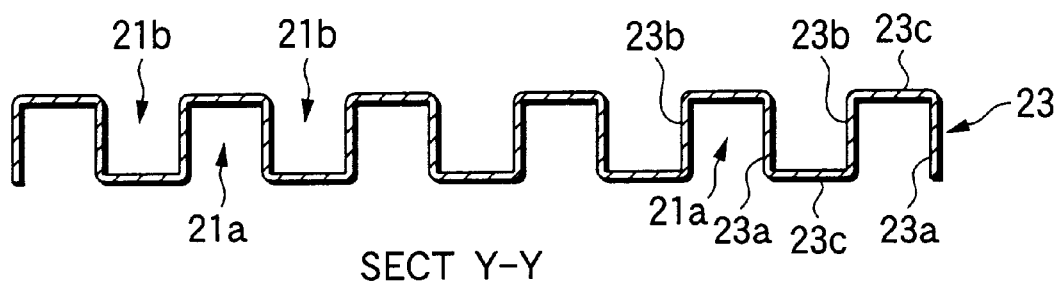
Figure 5:
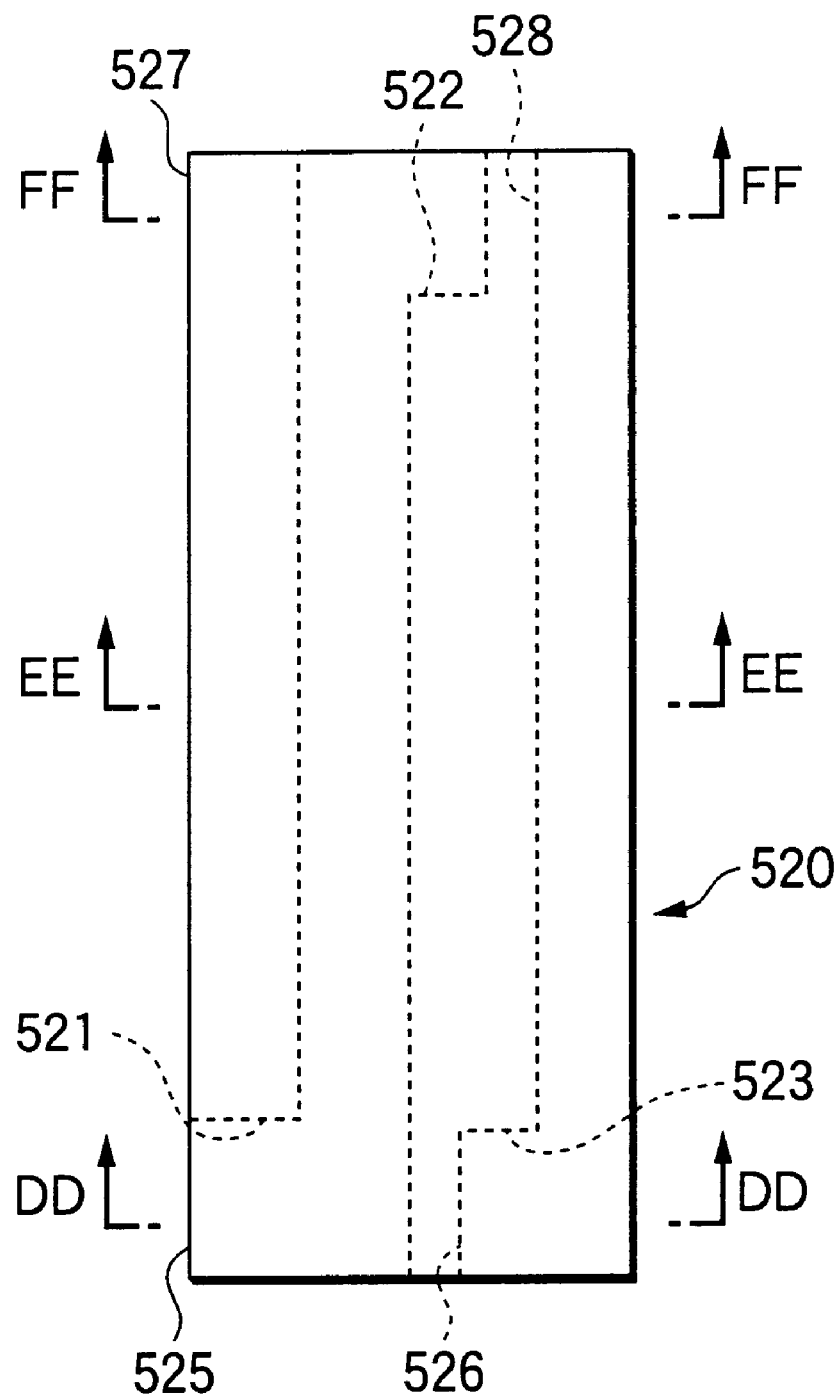
FIG. 5 is a plan view illustrating a die of a press mold for pressing the bent plate for the heat transfer apparatus with the zigzag pipe according to the first embodiment.
Figure 6:
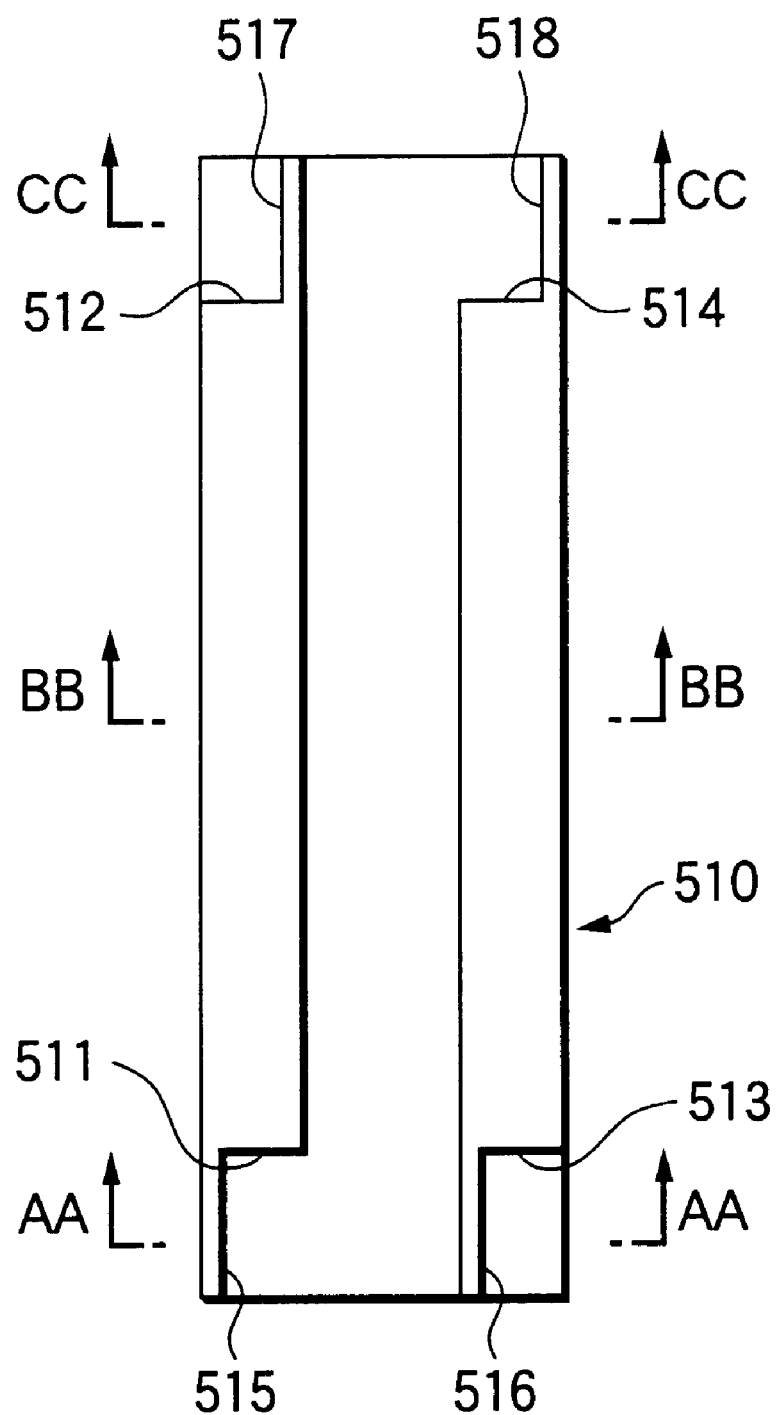
FIG. 6 is a plan view illustrating a punch of the press die for pressing the bent plate for the heat transfer apparatus with the zigzag pipe according to the first embodiment.

FIGS. 1 to 4 are views illustrating a heat transfer apparatus with a zigzag passage according to a first embodiment of the present invention. FIGS. 5 to 7 are views illustrating a press mold for pressing the parts for the apparatus.

Figure 2A:
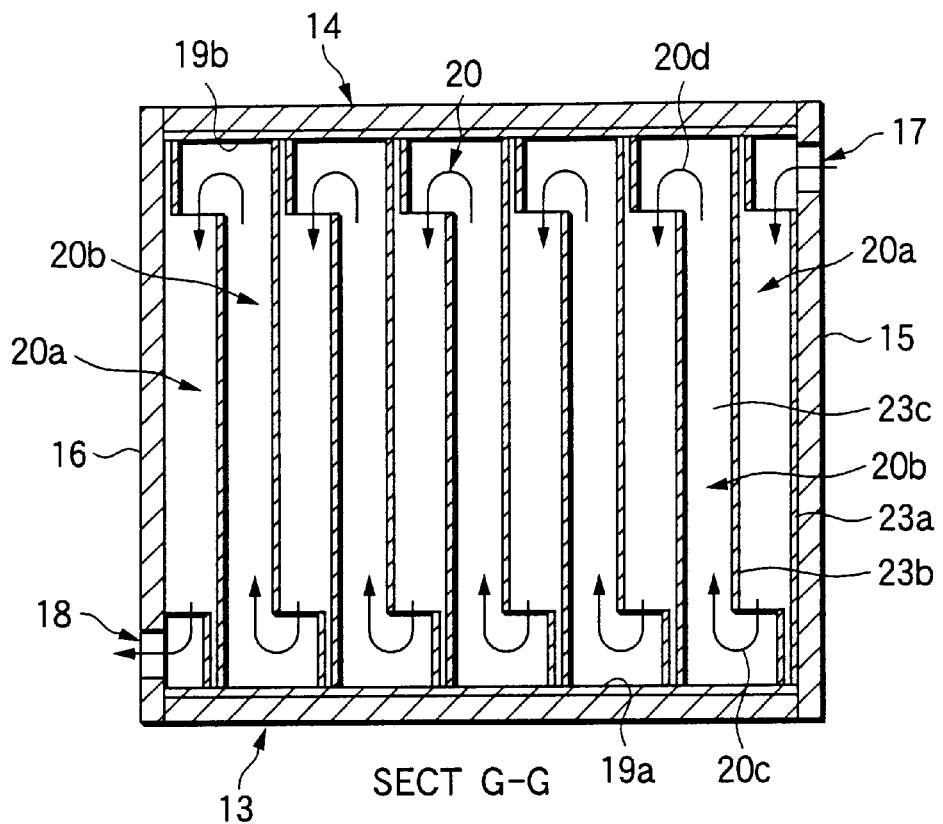
FIGS. 2(a) and (b) illustrate the interior structure of the heat transfer apparatus with the zigzag pipe according to the first embodiment of the present invention; (a) being a cross sectional view thereof taken along the line G—G of FIG. 1 (c) and (b) being a cross sectional view taken along line H—H of FIG. 1(a).
Figure 2B:
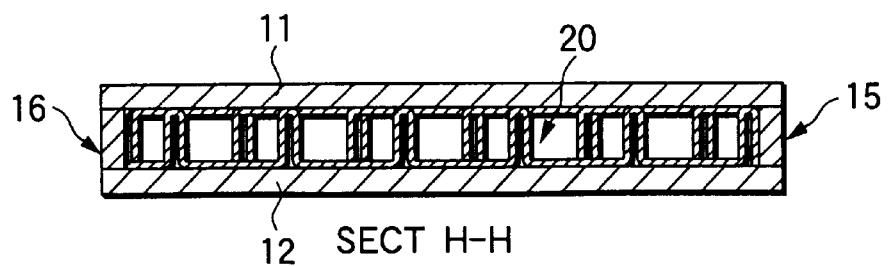
Figure 3A:
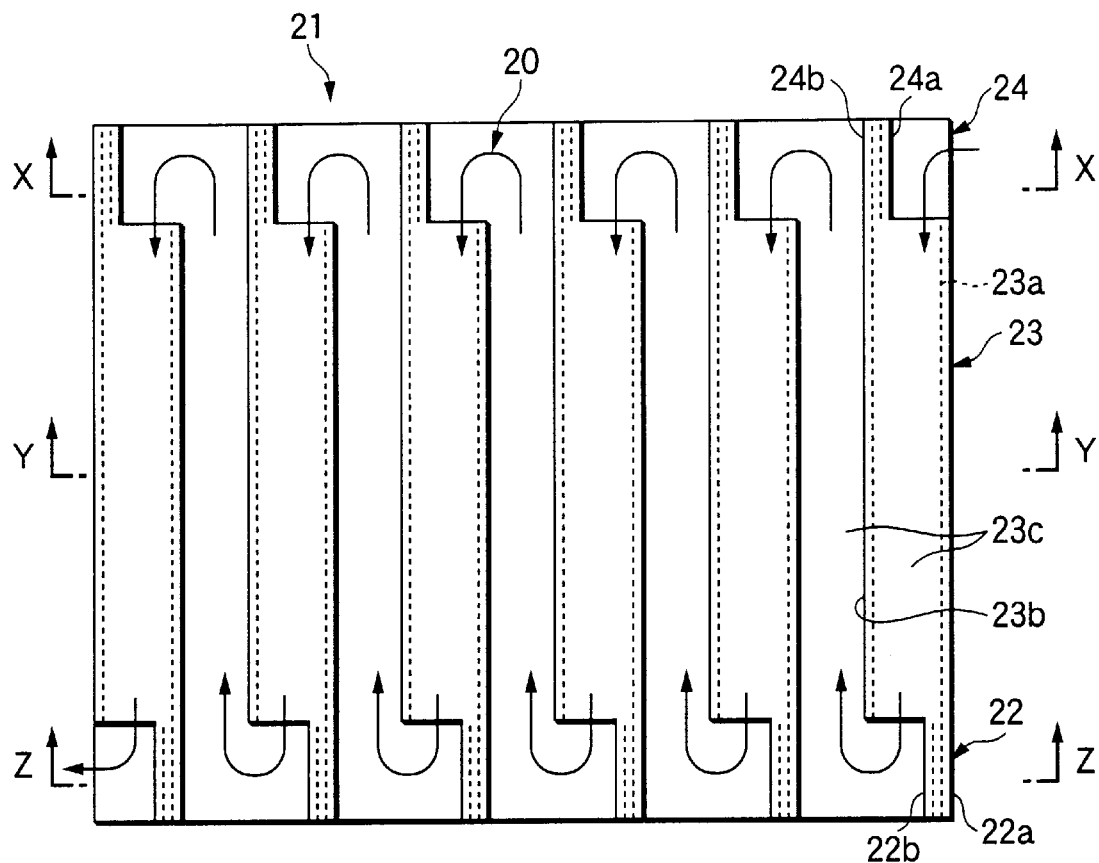
FIGS. 3(a) and (b) illustrate a bent plate in the heat transfer apparatus with the zigzag pipe according to the first embodiment; (a) being a plan view thereof and (b) being a front view thereof.
Figure 3B:
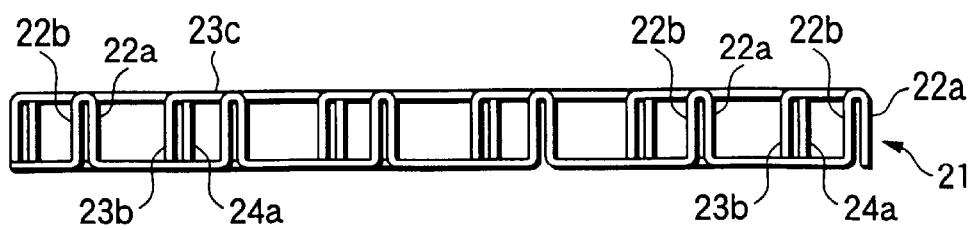

As shown in FIGS. 1 to 3, a heat transfer apparatus 10 with a zigzag passage is, for example, a flat plate-type heat exchanger, comprising a pair of rectangular opposed plates 11, 12 spaced apart from each other in parallel. The heat transfer apparatus 10 with a zigzag passage also comprises first cover members 13, 14 (a pair of cover members) interposed between the pair of the opposed plates 11, 12 so as to enclose opposite two sides of the heat transfer apparatus 10 with a zigzag passage. Moreover, the heat transfer apparatus 10 with a zigzag passage comprises second cover members 15, 16 provided on both end sides of the first cover members 13, 14 so as to enclose the other two sides of the heat transfer apparatus 10 with a zigzag passage. Here, at least one of the opposed plates 11, 12 forms a heat transfer surface through which heat transfers from a heat generating portion of an electronic device. The opposed plates 11, 12 and the cover members 13, 14, 15, 16 are brazed with brazing filler metal or bonded with adhesive.

In addition, a bent plate 21 is provided between the opposed plates 11, 12. A thin plate of predetermined metal (such as an aluminum alloy or copper) is bent to form the bent plate 21 in a wave shape. As shown in FIG. 2, the bent plate 21 divides the space between the pair of the opposed plates 11, 12 into a first side-by-side passage portion 20a through which a fluid flows downwardly and a second side-by-side passage portion 20b (a plurality of side-by-side passages) through which the fluid flows upwardly. In a cross section of the side-by-side passage portions 20a, 20b, the bent plate 21 has a wavy cross-sectional shape which forms alternately rectangular grooves 21a, 21b placed opposite to each other as shown in FIG. 4.

More specifically, the bent plate 21 has different wavy cross-sectional shapes at one end portion 22 in the direction of the length of the rectangular grooves 21a, 21b, at an intermediate portion 23, and at the other end portion 24. The intermediate portion 23 of the bent plate 21 defines the first side-by-side passage portion 20a and the second side-by-side passage portion 20b in parallel to each other. Moreover, the intermediate portion 23 of the bent plate 21 has both sidewall portions 23a, 23b and a bottom wall portion 23c of the rectangular grooves 21a or 21b. Incidentally, in this embodiment, both sidewall portions 23a, 23b and the bottom wall portion 23c are orthogonal to each other but may be at an angle to each other.

As shown in FIG. 3, the bent plate 21 has a cut line provided on both ends of the intermediate portion 23 in a direction orthogonal to the rectangular grooves 21a, 21b, allowing both end portions 22, 24 to be formed in a cross-sectional shape different from that of the intermediate portion 23. In addition, as shown in FIG. 4(b), the intermediate portion 23 is provided with a cross-sectional shape of rectangular waves having the same amplitude and wavelength every half a cycle. In contrast, as shown in FIGS. 4(a) and (c), both end portions 22, 24 are the same as the intermediate portion 23 in cycle of the waveform. That is, the widths of adjacent crests are equal to each other and the widths of adjacent troughs are equal to each other in half a cycle. However, half a cycle of the crest is narrowed down to approximately two times the thickness of the plate but the half a cycle of the trough is widened.

The pair of the first cover members 13, 14 is tightly bonded to the bent plate 21 via aluminum plates 19a, 19b, for example, having a brazing filler metal on both surfaces thereof at both end sides of the rectangular grooves 21a, 21b, thereby forming connecting portions 20c, 20d of the side-by-side passage portions 20a, 20b. The side-by-side passage portions 20a, 20b and the connecting portions 20c, 20d form a zigzag passage 20 which is alternately folded in opposite directions as one unit. One end of the zigzag passage 20 communicates with a fluid inlet 17 formed on one of the second cover member 15. The other end of the zigzag passage 20 communicates with a fluid outlet 18 formed on the other second cover member 16.

Figure 4C:
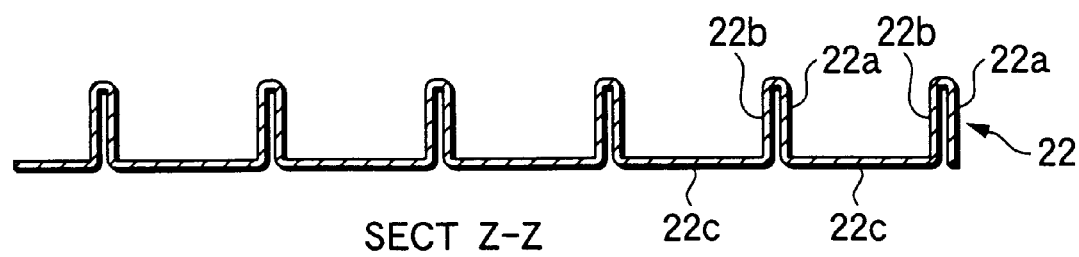

Incidentally, as shown in FIGS. 3 and 4(c), one end portion 22 of the bent plate 21 comprises one side wall extended portion 22a which extends one sidewall portion 23a of the intermediate portion 23 toward one end. One end portion 22 also comprises one bottom wall extended portion 22c, which extends the bottom wall portion 23c of the intermediate portion 23 toward one end at one of the crest or trough of the waveform of the bent plate 21, for example, at the trough in FIG. 4(c). Moreover, one end portion 22 comprises a plate-shaped coupling portion 22b coupled to one side wall extended portion 22a at the crest (any one of crest or trough of the waveform of the bent plate 21) shown in the figure and coupled to one bottom wall extended portion 22c at the trough. Here, the plate-shaped coupling portion 22b is folded from the side wall extended portion 22a at the crest of the waveform of the bent plate 21 so as to face the side wall extended portion 22a of the adjacent rectangular groove 21a or 21b, thereby coupling integrally the side wall extended portion 22a and the bottom wall extended portion 22c.

Similarly, as shown in FIGS. 3 and 4(a), the other end portion 24 of the bent plate 21 comprises the other side of a side wall extended portion 24b which extends the other sidewall portion 23b of the intermediate portion 23 toward one end. The other end portion 24 also comprises the other bottom wall extended portion 24c which extends the bottom wall portion 23c of the intermediate portion 23 toward the other end at any one of the crest or trough of the waveform of the bent plate 21, for example, at the trough in FIG. 4(a). Moreover, the other end portion 24 comprises a plate-shaped coupling portion 24a coupled to the other side wall extended portion 24b at the crest (any other crest or trough of the waveform of the bent plate 21) shown in the figure and coupled to one bottom wall extended portion 24c at the trough. Here, the plate-shaped coupling portion 24a is folded from the side wall extended portion 24b at the crest of the waveform of the bent plate 21 so as to face the side wall extended portion 24b of the adjacent rectangular groove 21a or 21b, thereby coupling integrally the side wall extended portion 24b and the bottom wall extended portion 24c.

In addition, one side wall extended portion 22a and the other side wall extended portion 24b protrude opposite to each other from the intermediate portion 23 of the bent plate 21. One side wall extended portion 22a is coupled to one end side of cover member 13 of the rectangular grooves 21a, 21b in conjunction with one bottom wall extended portion 22c and the plate-shaped coupling portion 22b. The other side wall extended portion 24b is coupled to the other cover member 14 of the rectangular grooves 21a, 21b in conjunction with the other bottom wall extended portion 24c and the plate-shaped coupling portion 24a. The connecting portions 20c, 20d between adjacent passages of the zigzag passage 20 are thereby formed in the general shape of the Japanese syllabic character "⊃", respectively.

That is, in this embodiment, the bottom wall extended portions 22c, 24c are extended sideways toward the side wall extended portions 22a, 24b of the adjacent rectangular grooves 21a, 21b to be formed in the general shape of the letter "L". The portion extended sideways of the bottom wall extended portions 22c, 24c and said side wall extended portions 22a, 24b of the adjacent rectangular grooves 21a, 21b are integrally coupled to each other by the plate-shaped coupling portions 22b, 24a facing the side wall extended portions 22a, 24b of said adjacent rectangular grooves. In addition, one side wall extended portion 22a of the rectangular grooves is integrally formed with another side wall extended portion via one bottom wall extended portion 22c and the other side wall extended portion 24b of rectangular grooves is integrally formed with another side wall extended portion via the other bottom wall extended portion 24c.

Here, the pressing of the bent plate 21 is explained. As shown in FIGS. 5 to 7, a punch 510 having shearing tooth portions 511, 512, 513, 514 and bent portion 515, 516, 517, 518 and a die 520 having shearing tooth portions 521, 522, 523 and bent portion 525, 526, 527, 528 are opened and closed in the mold in the two-way directions shown by the arrow of FIG. 7. Meanwhile, a flat-plate shaped metallic raw material (a flat plate raw material) is fed in between the punch 510 and the die 520 by one cycle of the waveform of the bent plate 21 to be pressed successively. This allows the flat-plate shaped metallic raw material to be plastically formed successively into a generally rectangular waveform having the rectangular grooves 21a, 21b, thereby making the bent plate 21.

As described above, in this embodiment, the bent plate 21 can be formed into a waveform shape by plastic pressing and then can be easily bonded to flat plates 11, 12, thus providing an easy method and reducing the cost of manufacture. Furthermore, bent plate 21 can provide sufficient bonding strength since the bent plate 21 can be bonded to opposite plates at a wide area using the bottom wall portion of the rectangular grooves 21a, 21b. Moreover, the sidewall portions 23a, 23b which are the ribs between the adjacent passage portions 20a, 20b are provided with the thickness of the plate-shaped material forming the bent plate 21, thereby making them thin and sturdy. Consequently, this makes it possible to provide a sufficient area for cooling the passages per unit heat transfer area and thus improve the heat transfer efficiency. Furthermore, forming holes or notches for folding the passage on both ends of the bent plate 21 and punching are not required in an additional step, thereby reducing the time of the manufacture.

Furthermore, in the heat transfer apparatus 10 with a zigzag passage according to this embodiment, the bent plate 21 is provided with the one and other side wall extended portions 22a, 24b, which protrude opposite to each other from the intermediate portion 23, and the bottom wall extended portions 22c, 24c on both ends of the intermediate portion 23. This facilitates the attachment (for example, brazing) of the first cover members 13, 14.

In addition, one side wall extended portion 22a is integrated with another side wall extended portion via one bottom wall extended portion 22c and the other side wall extended portion 24b is integrated with another side wall extended portion via the other bottom wall extended portion 24c. This allows the bent plate 21 to be provided with no projections and allows the opposed plates 11, 12 and the first cover members 13, 14 to be readily bonded to one another, thereby providing ease in of handling. Moreover, it is made possible to shear and bend the bent plate 21 by pressing or the like.

[Second Embodiment]

Figure 8B:
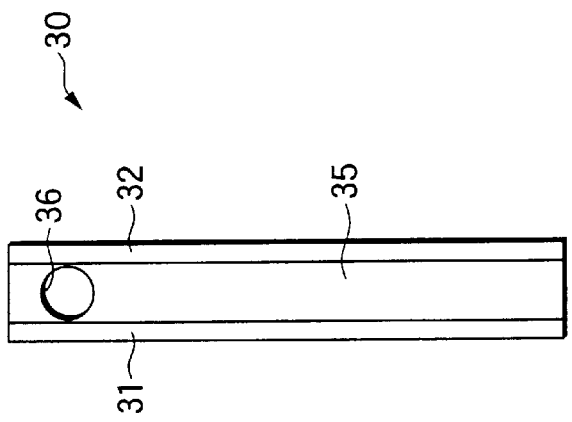
FIGS. 8(a), (b), and (c) illustrate a heat transfer apparatus with a zigzag pipe according to a second embodiment of the present invention; (a) being a plan view thereof, (b) being a side view thereof, and (c) being a front view thereof.
Figure 8A:
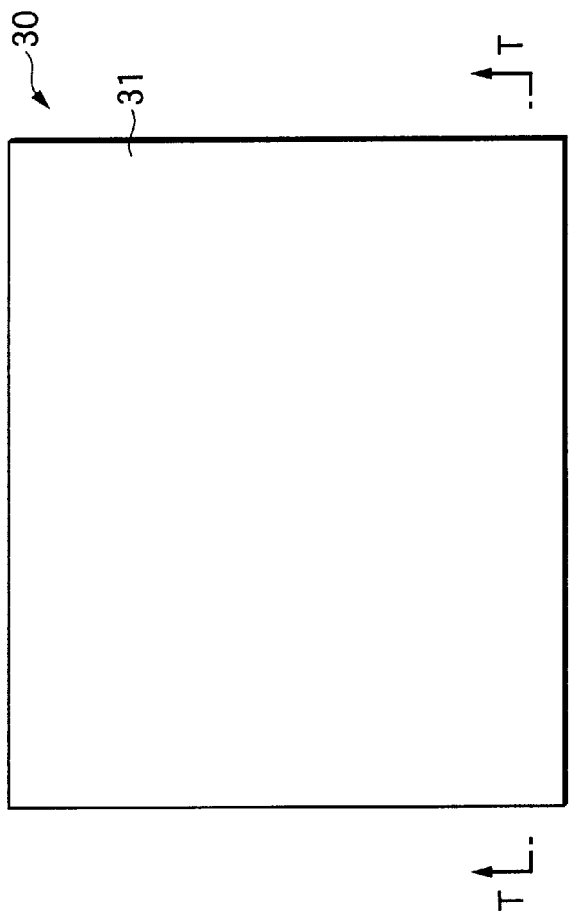
Figure 8C:
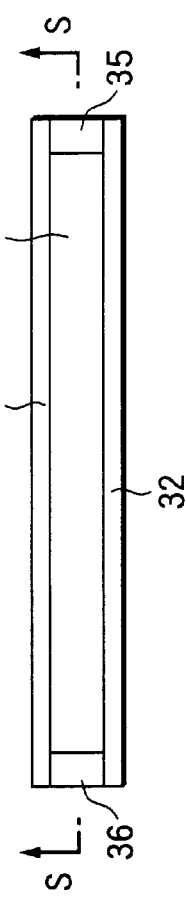

FIGS. 8 toll are views illustrating a heat transfer apparatus with a zigzag passage according to a second embodiment of the present invention.

Figure 9A:
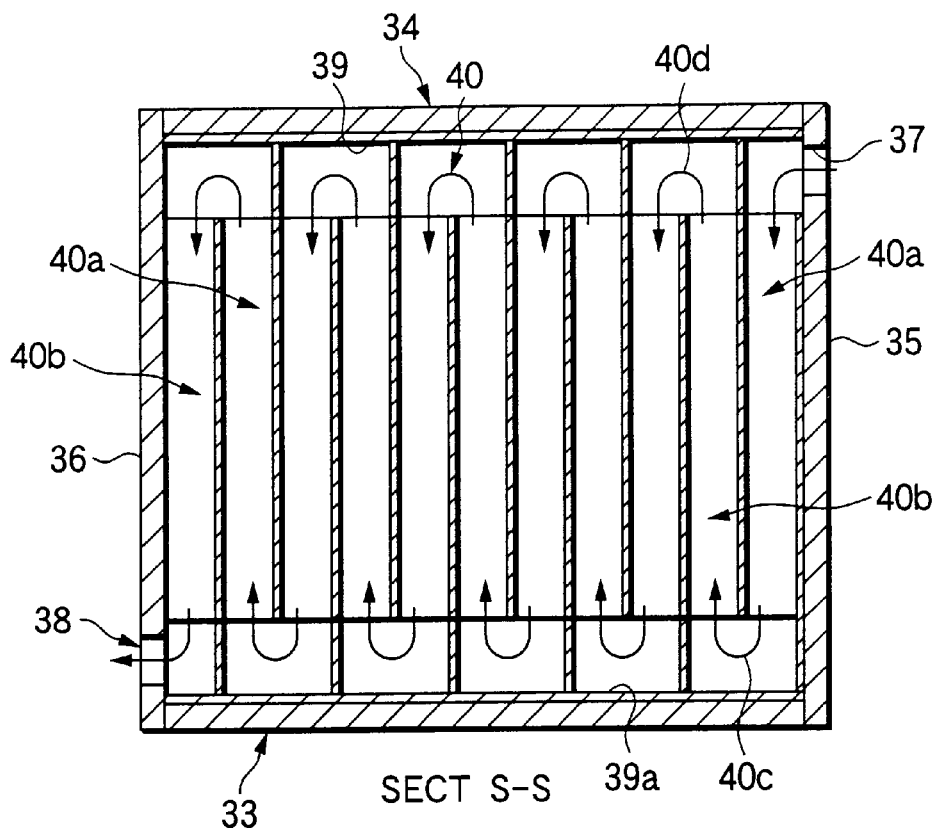
FIGS. 9(a) and (b) illustrate the internal structure of the heat transfer apparatus with the zigzag pipe according to the second embodiment; (a) being a cross sectional view taken along the line S—S of FIGS. 8(c) and (b) being a cross sectional view taken along the line T—T of FIG. 8(a).
Figure 9B:
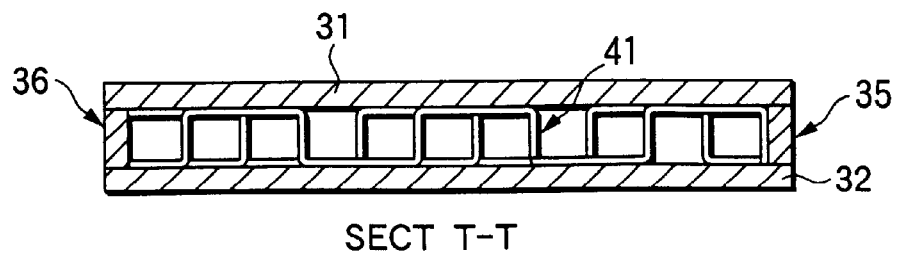
Figure 10A:
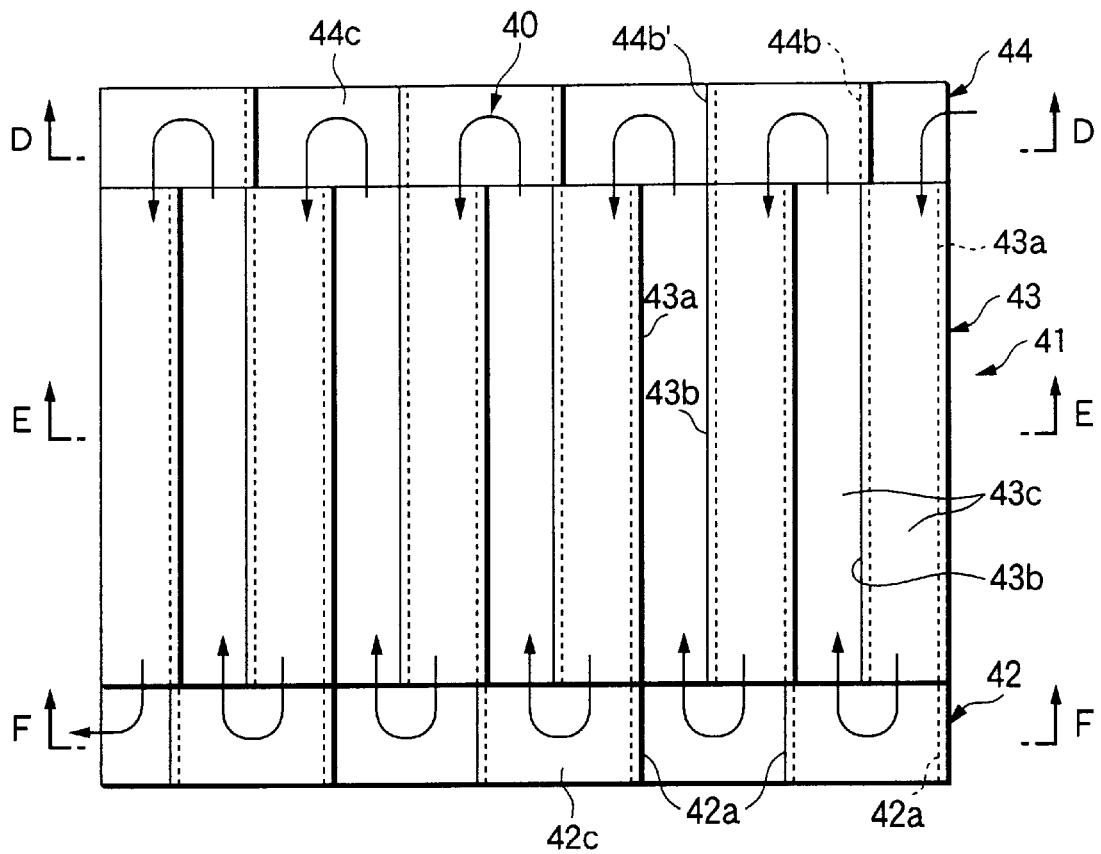
FIGS. 10(a) and (b) illustrate a bent plate for the heat transfer apparatus with the zigzag pipe according to the second embodiment; (a) being a plan view thereof and (b) being a front view thereof.
Figure 10B:
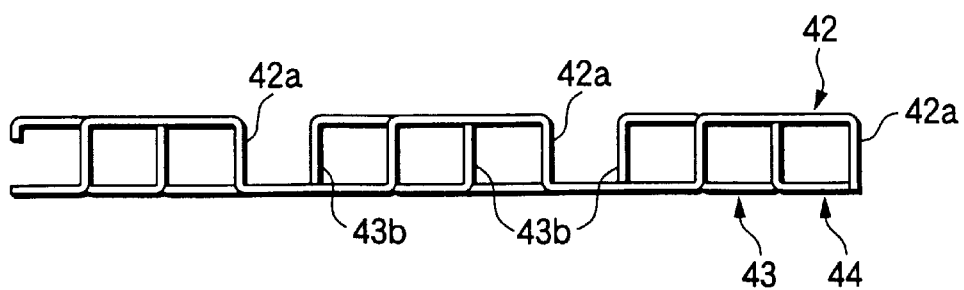

As shown in FIGS. 8 to 11, a heat transfer apparatus 30 with a zigzag passage according to the second embodiment comprises a pair of opposed plates 31, 32, first cover members 33, 34 (a pair of cover members) interposed between the opposed plates 31, 32, and second cover members 35, 36 provided on both ends of the first cover members 33, 34. There is also provided a bent plate 41 between the opposed plates 31, 32. As shown in FIG. 9, the bent plate 41 divides the space between the pair of the opposed plates 31, 32 into a first side-by-side passage portion 40a through which a fluid flows downwardly and a second side-by-side passage portion 40b (a plurality of side-by-side passages) through which the fluid flows upwardly. In a cross section of the side-by-side passage portions 40a, 40b, the bent plate 41 has a wavy cross-sectional shape which forms alternately rectangular grooves 41a, 41b placed opposite to each other as shown in FIGS. 10 and 11(b).

More specifically, the bent plate 41 has different wavy cross-sectional shapes individually bent at one end portion 42 in the direction of the length of the rectangular grooves 41a, 41b, at an intermediate portion 43, and at the other end portion 44 and are bonded to one another. In addition, the intermediate portion 43 of the bent plate 41 forms the rectangular groove 41a and 41b, opposite to each other, for defining the first side-by-side passage portion 40a and the second side-by-side passage portion 40b in parallel. For this purpose, the intermediate portion 43 of the bent plate 41 is provided with a general rectangular wave cross-sectional shape comprising both sidewall portions 43a, 43b and a bottom wall portion 43c of the rectangular grooves 41a and 41b. Furthermore, one end portion 42 and the other end portion 44 of the bent plate 41 each are formed in a generally rectangular wave cross-sectional shape having a wavelength two times the waveform of the intermediate portion 43. One end portion 42 and the other end portion 44 have a positional relationship in a waveform shifted by half the wavelength of the waveform of the intermediate portion 43.

Figure 11A:
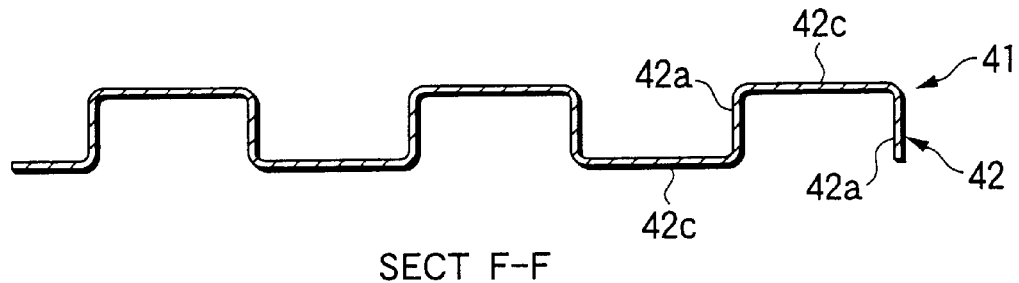
FIGS. 11(a), (b), and (c) illustrate the cross sectional shape of the bent plate for the heat transfer apparatus with the zigzag pipe according to the second embodiment; (a) being a cross sectional view taken along the line F—F of FIG. 10(a), (b) being a cross sectional view taken along the line E—E of FIG. 10 (b), and (c) being a cross sectional view taken along the line D—D of FIG. 10(a).
Figure 11B:
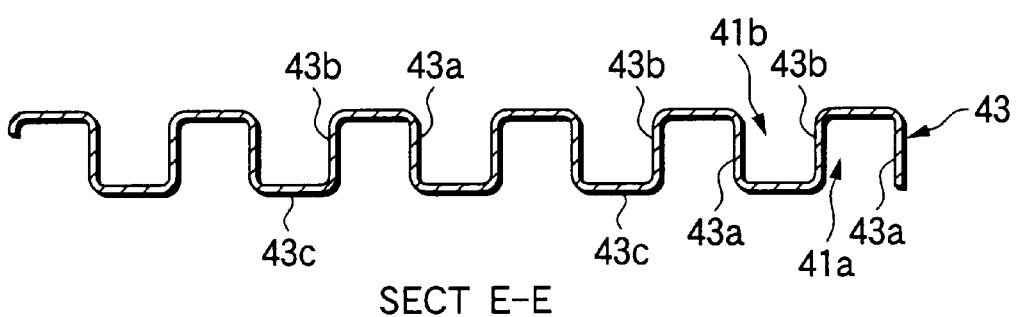
Figure 11C:
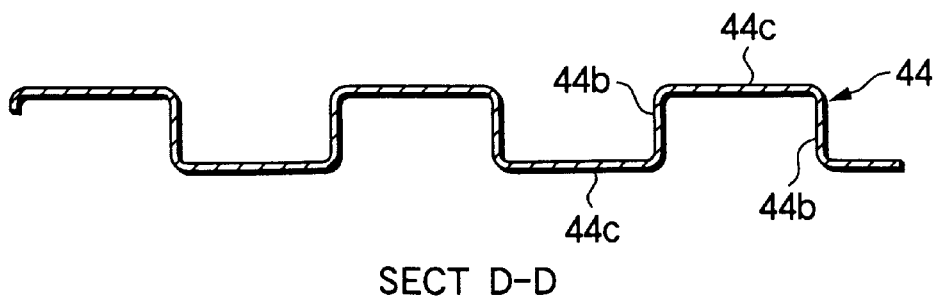

Furthermore, as shown in FIGS. 10 and 11 (a), one end portion 42 of the bent plate 41 comprises one side wall extended portion 42a which extends one sidewall portion 43a of the intermediate portion 43 toward one end. One end portion 42 also comprises one bottom wall extended portion 42c which extends the bottom wall portion 43c of the intermediate portion 43 toward one end at one of the crest or trough of the waveform of the bent plate 41, for example, at the trough in FIG. 11(a). Likewise, as shown in FIGS. 10 and 11(a), the other end portion 44 of the bent plate 41 comprises the other side wall extended portion 44b which extends the other sidewall portion 43b of the intermediate portion 43 toward one end. The other end portion 44 also comprises the other bottom wall extended portion 44c which extends the bottom wall portion 43c of the intermediate portion 43 toward one end at one of the crest or trough of the waveform of the bent plate 41, for example, at the trough in FIG. 11 (c). In addition, one bottom wall extended portion 42c and one side wall extended portion 42a are coupled to the cover member 33 on one end of the rectangular grooves 41a, 41b. On the hand, the other bottom wall extended portion 44c and the other side wall extended portion 44b are coupled to the cover member 34 on the other end of the rectangular grooves 41a, 41b. Folded portions 40c, 40d of a zigzag passage 40 are thereby formed.

In this embodiment, the bent plate 41 can be easily manufactured by pressing. Moreover, the sidewall portions 43a, 43b which are ribs between the adjacent passages 40a, 40b are provided with the thickness of the plate-shape material forming the bent plate 41, thereby providing the same effect as the aforementioned embodiment. Furthermore, this embodiment also allows one bottom wall extended portion 42c and one side wall extended portion 42a to be coupled to the cover member 33 on one end, and the other bottom wall extended portion 44c and the other side wall extended portion 44b to be coupled to the cover member 34 on the other end. This facilitates the attachment of the cover members 33, 34.

[Third Embodiment]

FIGS. 12 to 15 are views illustrating a heat transfer apparatus with a zigzag passage according to a third embodiment of the present invention.

Figure 13A:
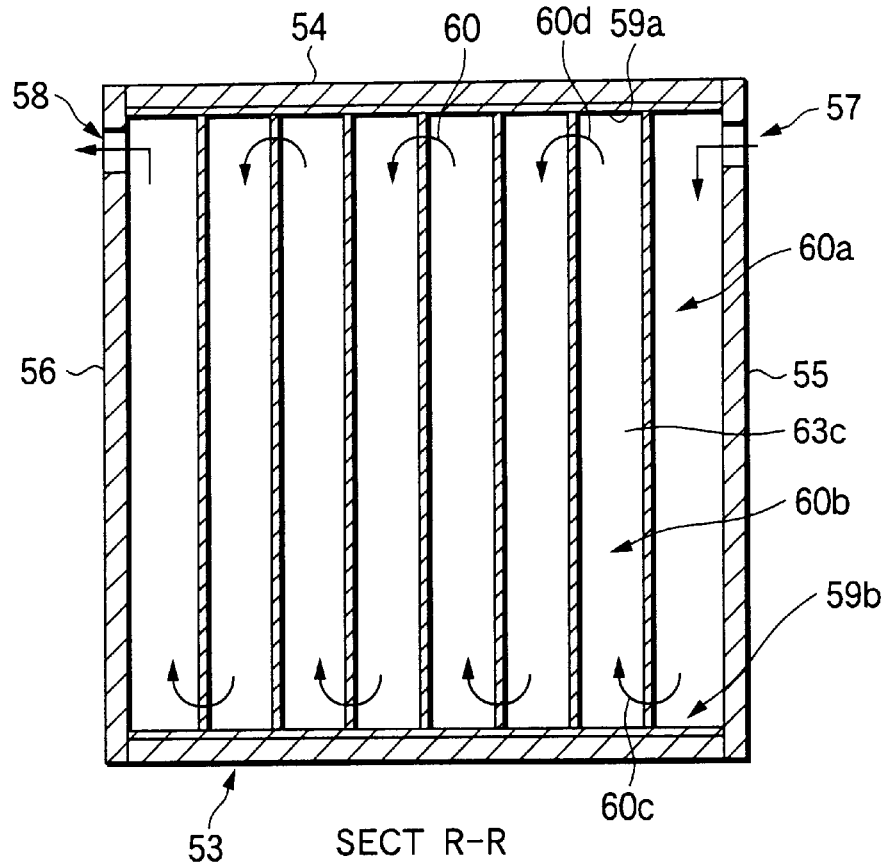
FIGS. 13(a) and (b) illustrate the interior structure of the heat transfer apparatus with the zigzag pipe according to the third embodiment; (a) being a cross sectional view taken along the line R—R of FIGS. 12(c) and (b) being a cross sectional view taken along the line Q—Q of FIG. 12(a).
Figure 13B:
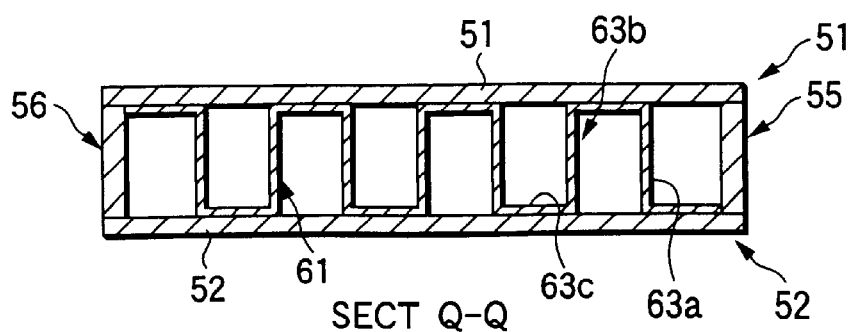
Figure 14A:
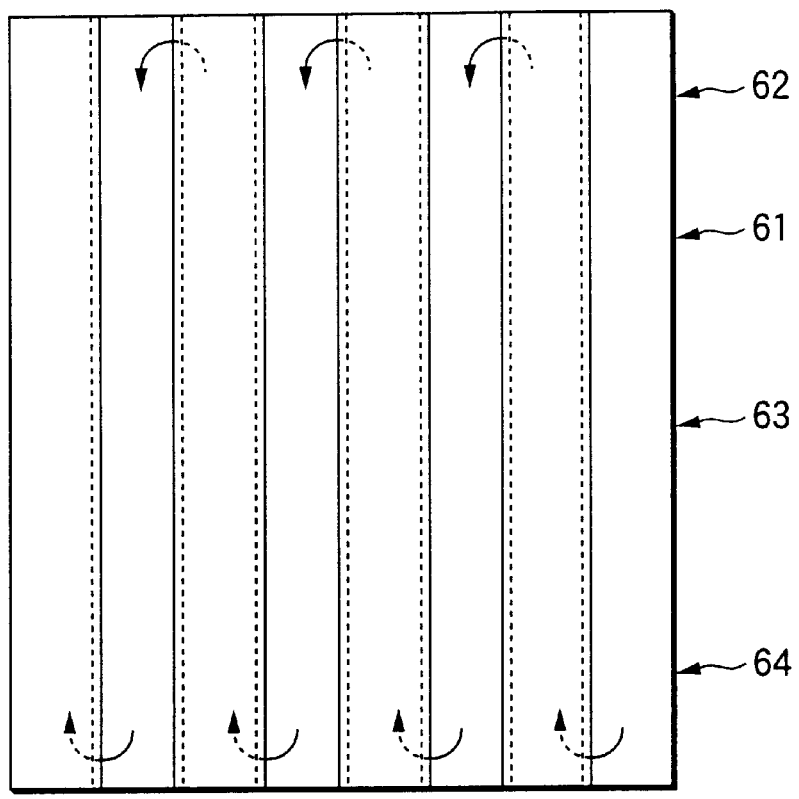
FIGS. 14(a) and (b) illustrate a bent plate for the heat transfer apparatus with the zigzag pipe according to the third embodiment; (a) being a plan view thereof and (b) being a front view thereof.
Figure 14B:
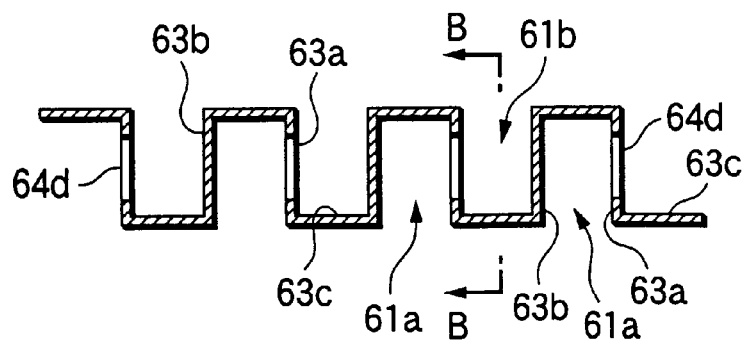

As shown in FIGS. 12 and 13, a heat transfer apparatus 50 with a zigzag passage according to the third embodiment comprises a pair of opposed plates 51, 52, first cover members 53, 54 (a pair of cover members) interposed between the opposed plates 51, 52, and second cover members 55, 56 provided on both ends of the first cover members 53, 54. There is also provided a bent plate 61 between the opposed plates 51, 52. As shown in FIG. 13, the bent plate 61 divides the space between the pair of the opposed plates 51, 52 into a first side-by-side passage portion 60a through which a fluid flows downwardly and a second side-by-side passage portion 60b (a plurality of side-by-side passages) through which the fluid flows upwardly. In a cross section of the side-by-side passage portions 60a, 60b, the bent plate 61 has a wavy cross-sectional shape which forms alternately rectangular grooves 61a, 61b placed opposite to each other as shown in FIGS. 14 and 15.

More specifically, the bent plate 61 has one end portion 62 in the direction of the length of the rectangular grooves 61a, 61b, an intermediate portion 63, and the other end portion 64. These are allowed to form the rectangular grooves 61a, 61b, opposite to each other, for defining the first side-by-side passage portion 60a and the second side-by-side passage portion 60b. For this purpose, the intermediate portion 63 is provided with a general rectangular wave cross-sectional shape comprising both sidewall portions 63a, 63b and a bottom wall portion 63c of the rectangular grooves 61a or 61b.

Figure 15:
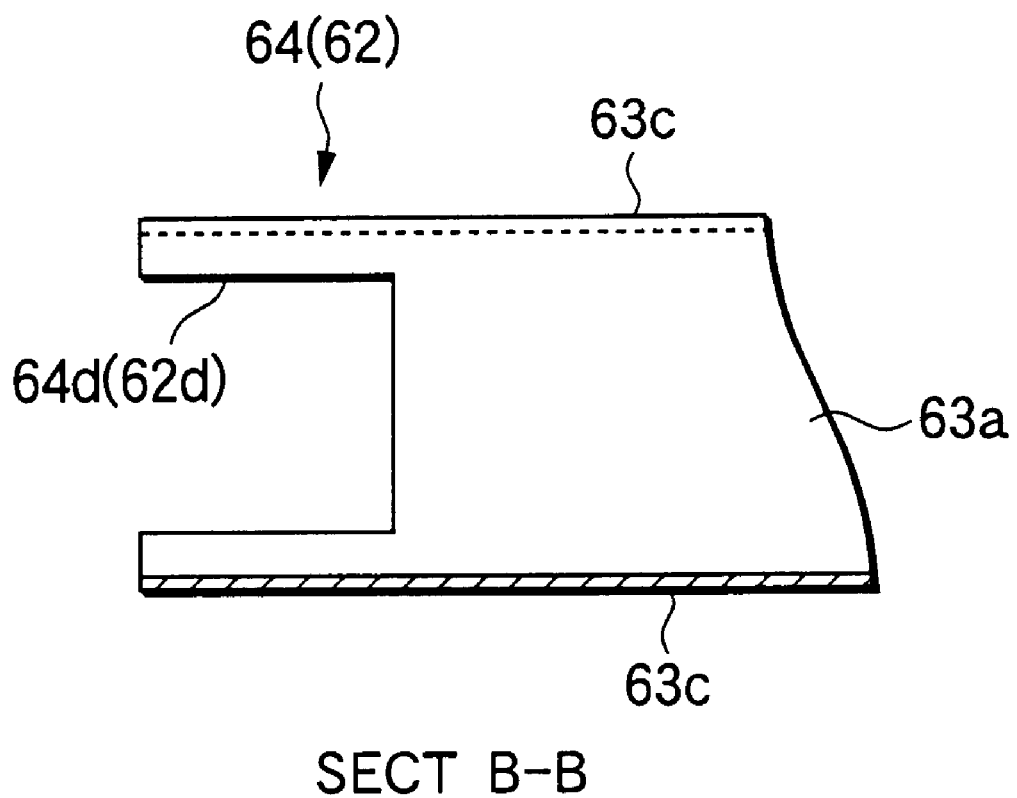
FIG. 15 is a partially enlarged view including a partially cross sectional view of the bent plate for the heat transfer apparatus with the zigzag pipe according to the third embodiment.

Furthermore, as shown in FIG. 15, one end portion 62 and the other end portion 64 of the bent plate 61 have one communicating notch portion 62d obtained by partially cutting off one end of one of both sidewall portions 63a, 63b of each of the rectangular grooves 61a, 61b or one sidewall portion 63a, and the other communicating notch portion 64d obtained by partially cutting off the other end of one of both sidewall portions 63a, 63b of each of the rectangular grooves 61a, 61b or the other sidewall portion 63b. One end portion 62 and the other end portion 64 of the bent plate 61, where the communicating notch portions 62d, 64d are formed, are coupled to the cover members 53, 54 via adhesive layers 59a, 59b to form folded portions 60c, 60d of a zigzag passage 60.

In this embodiment, the bent plate 61 can be easily manufactured by pressing. Moreover, the sidewall portions 63a, 63b or ribs between the adjacent passages 60a, 60b are provided with the thickness of the plate-shape material forming the bent plate 61, thereby providing the same effect as the aforementioned embodiment.

[Fourth Embodiment]

Figure 16B:
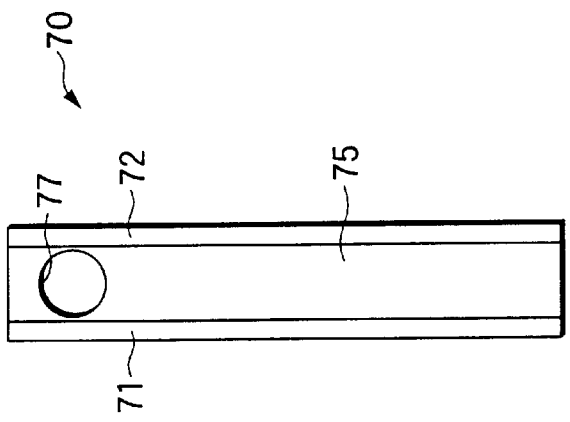
FIGS. 16(a), (b), and (b) illustrate a heat transfer apparatus with a zigzag pipe according to a fourth embodiment of the present invention (a) being a plan view thereof, (b) being a side view thereof, and (c) being a front view thereof.
Figure 16A:
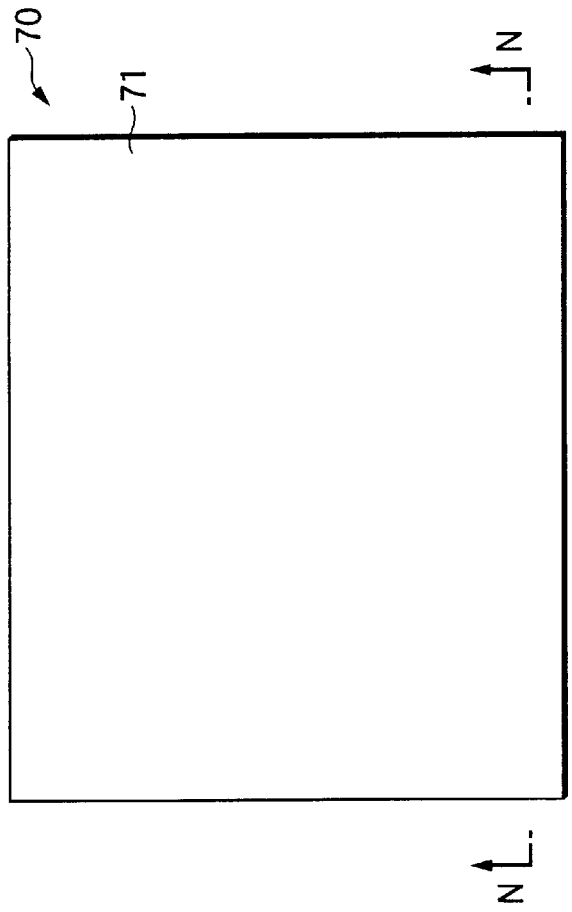
Figure 16C:
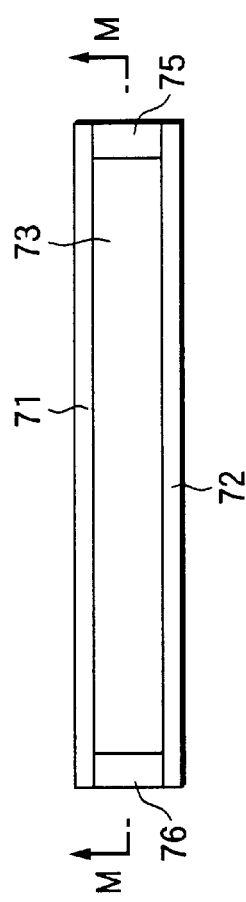
Figure 17A:
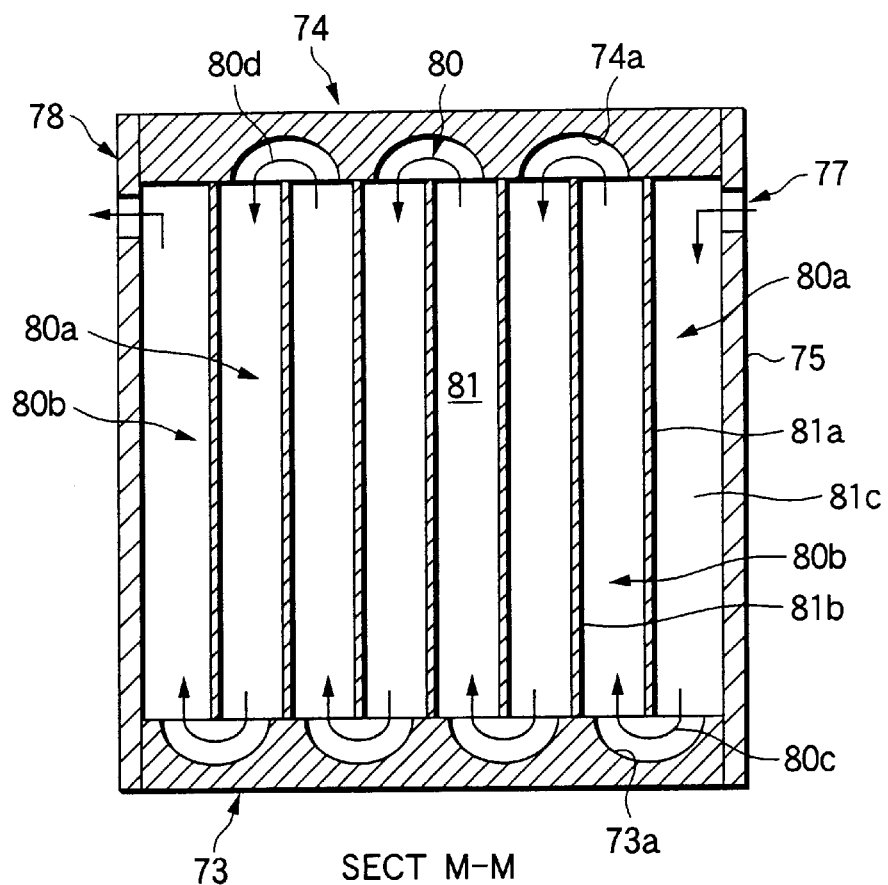
FIGS. 17(a) and (b) illustrate the interior structure of the heat transfer apparatus with the zigzag pipe according to the fourth embodiment; (a) being a cross sectional view taken along the line M—M of FIGS. 16(c) and (b) being cross sectional view taken along the line N—N of FIG. 16(a).

FIGS. 16 and 17 are views illustrating a heat transfer apparatus with a zigzag passage according to a fourth embodiment of the present invention.

Figure 17B:
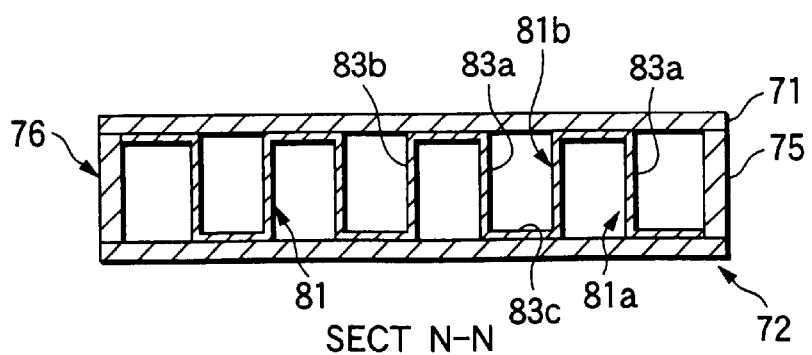
Figure 18:
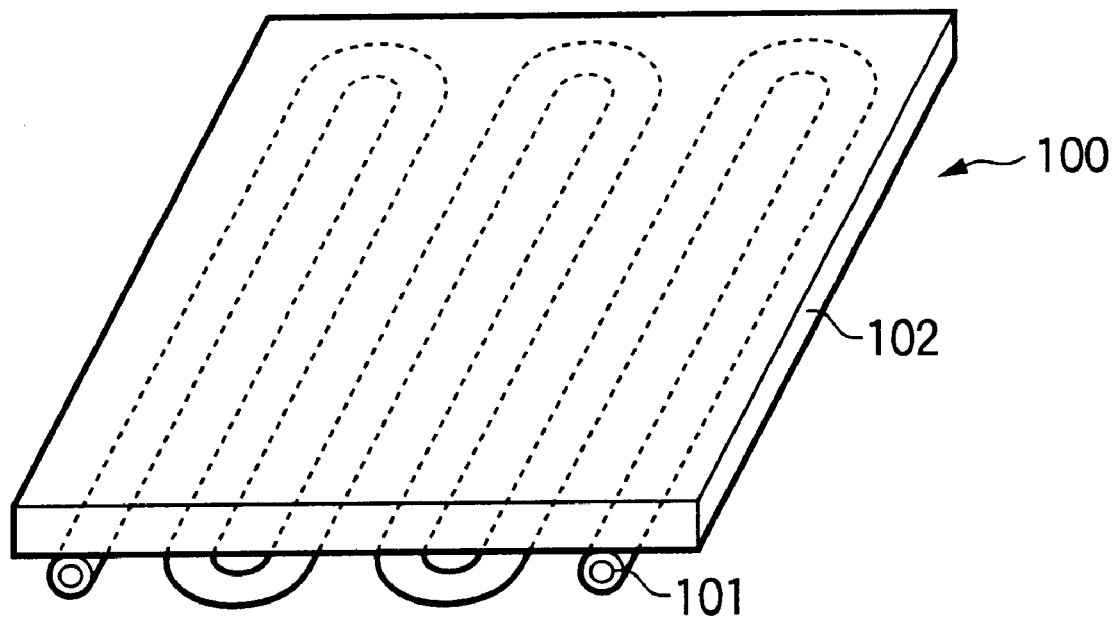
FIG. 18 is a perspective view illustrating an example of a conventional heat transfer apparatus with a zigzag pipe.
Figure 19:
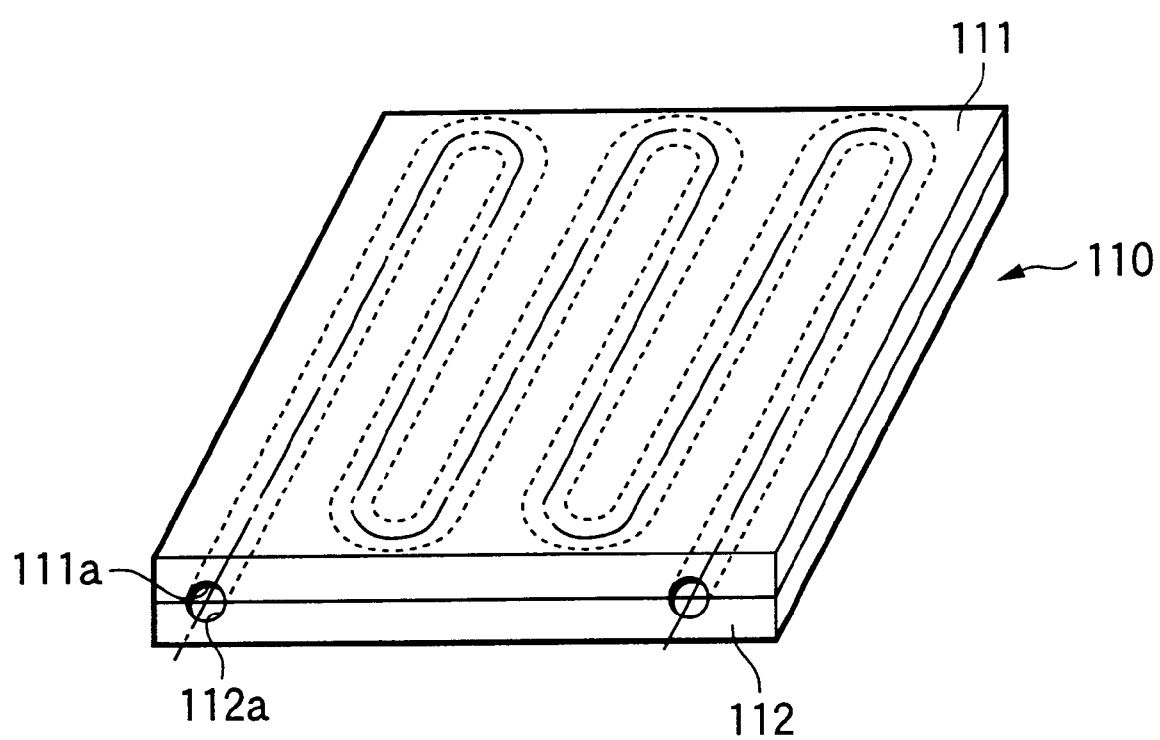
FIG. 19 is a perspective view illustrating another example of the conventional heat transfer apparatus with the zigzag pipe.

As shown in FIGS. 16 and 17, a heat transfer apparatus 70 with a zigzag passage according to the fourth embodiment comprises a pair of opposed plates 71, 72, first cover members 73, 74 (a pair of cover members) interposed between the opposed plates 71, 72, and second cover members 75, 76 provided on both ends of the first cover members 73, 74. There is also provided a bent plate 81 between the opposed plates 71, 72. As shown in FIG. 13, the bent plate 81 divides the space between the pair of the opposed plates 71, 72 into a first side-by-side passage portion 80a through which a fluid flows downwardly in FIG. 13 and a second side-by-side passage portion 80b (a plurality of side-by-side passages) through which the fluid flows upwardly. In a cross section of the side-by-side passage portions 80a, 80b, the bent plate 81 has a wavy cross-sectional shape which forms alternately rectangular grooves 81a, 81b placed opposite to each other as shown in FIG. 17(b).

More specifically, the bent plate 81 has a general rectangular wave cross-sectional shape comprising both sidewall portions 83a, 83b and a bottom wall portion 83c of the rectangular grooves 81a or 81b. In addition, the bent plate 81 is coupled to the cover members 73, 74 on both ends thereof. Recessed portions 73a, 74a, having a circular arc bottom surface formed on the cover members 73, 74, form folded portions 80c, 80d of a zigzag passage 80.

In this embodiment, the bent plate 81 can be easily manufactured by pressing. Moreover, the sidewall portions 83a, 83b or ribs between the adjacent passages 80a, 80b are provided with the thickness of the plate-shape material forming the bent plate 81, thereby providing the same effect as the aforementioned embodiment.

EXAMPLE 1

A cooling apparatus or the heat transfer apparatus 10 with the zigzag passage, for circulating cold water through the zigzag passage 20 can be easily manufactured in the following steps. That is, the bent plate 21 is formed of a plate of an aluminum alloy (of thickness 0.1 mm) specified in JIS H 4000 A3003P. Then, the bent plate 21 is abutted to the opposed plates 11, 12 formed of a brazing sheet (an aluminum plate with brazing filler metal) specified in JIS Z 3263 BA5121P and to the cover members 13–16 formed of an aluminum alloy plate (JIS H 4000 A3003P). Then, they are heated up to 590 to 605° C. to be brazed to each other. Thus, the heat transfer apparatus 10 with a zigzag passage can be manufactured.

EXAMPLE 2

A cooling apparatus or the heat transfer apparatus 50 with a zigzag passage for circulating cold water through the zigzag passage can be easily manufactured in the following steps. That is, the bent plate 61 is formed of a stainless steel plate having a thickness of 0.5 mm. Then, the bent plate 61 is provided by electric discharge machining with the communicating notch portions 62d, 64d for connecting adjacent passages to each other. Thereafter, the bent plate 61 is abutted to the opposed plates 51,52 formed of a stainless steel plate and the cover members 53–56 to be bonded to each other with adhesive. Thus, the heat transfer apparatus 50 with a zigzag passage can be manufactured.

EXAMPLE 3

A cooling apparatus or the heat transfer apparatus 30 with the zigzag passage for circulating cold water through the zigzag passage 40 can be easily manufactured in the following steps. That is, the bent plate 41 is formed of a copper plate having a thickness of 0.1 mm. Then, the bent plate 41 is abutted to the opposed plates 31, 32 formed of copper and the cover members 33–36. They are heated up and brazed to bond to each other. Thus, the heat transfer apparatus 30 with a zigzag passage can be manufactured.

Incidentally, the aforementioned embodiments and examples are configured as a heat exchanger for circulating a liquid such as cold water as a heat medium through the zigzag passage. However, as a matter of course, the present invention is not limited to cooling use. Furthermore, it is also possible to form a zigzag heating pipe for conducting heat for averaging the temperature from a lower to a higher temperature portion on the plate as a configuration for filling a working fluid of two phases of gas and liquid into the zigzag passage and sealing the zigzag passage.

Furthermore, all of the aforementioned embodiments and examples are flat plate-type heat transfer apparatuses with a zigzag passage. However, while the side-by-side arrangement (which is not necessarily a parallel arrangement) of the side-by-side passages is maintained in the shape of a curved heat transfer surface of the opposed plates, it is also possible to make the side-by-side surface curved or bent. In addition, a plurality of adjacent side-by-side passages may be curved in the same direction to be arranged side by side.

According to the present invention, one side wall portion of both side wall portions of the rectangular grooves of the bent plate is coupled to one end of the cover members of the rectangular grooves. The other side wall portion of both side wall portions of the rectangular grooves is coupled to the other end of the cover members of the rectangular grooves. A zigzag passage is formed in which one side of each of the rectangular grooves is folded to oppose the other side of its rectangular groove, thus making it possible to easily form the bent plate of a flat plate material by pressing. The thickness of said side wall portion which is a rib between adjacent passages can be made thin and sturdy, thereby making it possible to narrow the spacing between the adjacent passages and raising the heat transfer efficiency. Furthermore, the bent plate can be easily and positively bonded to the opposed plates over a wide area using the bottom wall portion of the rectangular grooves, thereby making it possible to provide sufficient bonding strength.

What is claimed is:

1. A heat transfer apparatus with a zigzag passage comprising:
   a pair of opposed plates at least one plate of the pair of opposed plates forming a heat transfer surface,
   a bent plate having a wavy cross-sectional shape forming rectangular grooves alternately opposite to each other in a cross section of the zigzag passage so as to divide a space between said pair of opposed plates into a plurality of side-by-side passages, wherein said bent plate includes side wall portions so that each adjacent pair of the side wall portions defines a rectangular groove therebetween, and
   a pair of cover members bonded to said bent plate at both ends of the rectangular grooves of said bent plate and forming connecting portions between said side-by-side passages,
   wherein one side wall portion of said adjacent pair of side wall portions is coupled to one cover member of said pair of cover members, and an other side wall portion of said adjacent pair of side wall portions is coupled to an other cover member of said pair of cover members, so that the zigzag passage has a flow direction from one of the rectangular grooves to an adjacent rectangular groove, the flow direction changed at one of the ends of said one of the rectangular grooves, and
   wherein both ends of each rectangular groove form an end portion, and only one of the two end portions of each groove is coupled to a corresponding cover member of said pair of cover members in one side wall portion of each rectangular groove.

2. The heat transfer apparatus according to claim 1, wherein
   on any one of a crest or a trough of a waveform of said bent plate, provided are one bottom wall extended portion and an other bottom wall extended portion, the bottom wall extended portions formed by extending a bottom wall portion of said rectangular grooves toward both ends of said rectangular grooves,
   said one side wall portion is extended to one end of said rectangular grooves and said other side wail portion is extended to an other end of said rectangular grooves to provide one side wall extended portion and an other side wall extended portion, and
   said one bottom wall extended portion and said one side wall extended portion are coupled to one cover member of the pair of cover members on the one end of said rectangular grooves and said other bottom wall extended portion and said other side wall extended portion are coupled to the other cover member of the pair of covet member on the other end of said rectangular grooves.

3. The heat transfer apparatus according to claim 2, wherein
   said bottom wail extended portions are extended sideward of the corresponding side wall extended portions of the adjacent rectangular grooves, a portion extended sidewall of said bottom wall extended portions and said corresponding side wall extended portions of the adjacent rectangular grooves are integrally coupled to each other by a plate-shaped coupling portion opposite to the corresponding side wall extended portions of the adjacent rectangular grooves, and
   said side wall extended portions are integrally formed with said corresponding bottom wall extended portions.

4. A heat transfer apparatus with a zigzag passage, comprising:
   a pair of opposed plates having surfaces;
   a one-piece wavy plate interposed between the pair of opposed plates, the one-piece wavy plate including:
      an intermediate portion having a first wavy cross section defining and partitioning side-by-side passages, in a first direction substantially parallel to the surfaces of the pair of opposed plates;
      a first end portion having a second wavy cross section communicating one tad of each of the side-by-side passages with a corresponding end of an adjacent passage; and
      a second end portion having a third wavy cross section communicating an other end of the side-by-side passages with a corresponding other end of an adjacent passage;
      a first pair of cover members located opposite to each other in a second direction perpendicular to the first direction, one cover member attached to the first end portion and an other cover member attached to the second end portion, and
      first and second side wall portions defining a rectangular groove corresponding to each side-by-side passage, wherein only one of the two side wall portions is coupled to one cover member of said pair of cover members at one end of each rectangular groove.

5. The heat transfer apparatus according to claim 4, further comprising:
   a second pair of cover members, one cover member having a fluid inlet, the other cover member having a fluid outlet, wherein the second pair of cover members are located opposite to each other, generally parallel to the side-by-side passages and attached to the first cover members.

6. The heat transfer apparatus of claim 1, wherein only one of the two side wall portions is coupled to one cover member of said pair of cover members at one end of each rectangular groove.

7. A heat transfer apparatus with a zigzag passage comprising:
   a pair of opposed plates at least one plate of the pair of opposed plates forming a heat transfer surface,
   a bent plate having a wavy cross-sectional shape forming rectangular grooves alternately opposite to each other in a cross section of the zigzag passage so as to divide a space between said pair of opposed plates into a plurality of side-by-side passages, wherein said bent plate includes side wall portions so that each adjacent pair of the side wall portions defines a rectangular groove therebetween, and a pair of cover members bonded to said bent plate at both ends of the rectangular grooves of said bent plate and forming connecting portions between said side-by-side passages, wherein one side wall onion of said adjacent pair of side wall portions is coupled to one cover member of said pair of cover members, and an other side wall portion of said adjacent pair of side wall portions is coupled to an other cover member of said pair of cover members, so that the zigzag passage has a flow direction from one of the rectangular grooves to an adjacent rectangular groove, the flow direction chan ed at one of the ends of said one of the rectangular grooves, and wherein the flow directions are opposite to each other in each adjacent side-by-side passage.

8. The heat transfer apparatus of claim 4, the wavy plate further including first and second side wall portions defining a rectangular groove corresponding to each side-by-side passage, wherein only one of the two end portions is coupled to a corresponding cover member of said pair of cover members in one side wall portion of each rectangular groove.

9. The heat transfer apparatus of claim 4, wherein the flow directions are opposite to each other in each adjacent side-by-side passage.

10. The heat transfer apparatus according to claim 7, wherein on any one of a crest or a trough of a waveform of said bent plate, provided are one bottom wall extended portion and an other bottom wall extended portion, the bottom wall extended portions formed by extending a bottom wall portion of said rectangular grooves toward both ends of said rectangular grooves, said one side wail portion is extended to one end of said rectangular grooves and said other side wall portion is extended to an other end of said rectangular grooves to provide one side wall extended portion and an other side wall extended portion, and said one bottom wall extended portion and said one side wall extended portion are coupled to one cover member of the pair of cover members on the one end of said rectangular grooves and said other bottom wall extended portion and said other side wall extended portion are coupled to the other cover member of the pair of cover member on the other end of said rectangular grooves.

11. The heat transfer apparatus according to claim 10, wherein said bottom wall extended portions are extended sideward of the corresponding side wall extended portions of the adjacent rectangular grooves, a portion extended sideward of said bottom wall extended portions and said corresponding side wall extended portions of the adjacent rectangular grooves are integrally coupled to each other by a plate-shaped coupling portion opposite to the corresponding side wall extended portions of the adjacent rectangular grooves, and said side wail extended portions are integrally formed with said corresponding bottom wall extended portions.

12. The heat transfer apparatus of claim 7, wherein only one of the two side wall portions is coupled to one cover member of said pair of cover members at one end of each rectangular groove.

* * * * *